(12) United States Patent
Lee

(10) Patent No.: US 11,062,949 B2
(45) Date of Patent: Jul. 13, 2021

(54) METHOD OF MANUFACTURING POWER DEVICE WITH IMPROVED THE UTILIZATION RATE OF WAFER AREA

(71) Applicant: Yi-Hui Lee, Taichung (TW)

(72) Inventor: Yi-Hui Lee, Taichung (TW)

(*) Notice: Subject to any disclaimer, the term of this patent is extended or adjusted under 35 U.S.C. 154(b) by 0 days.

(21) Appl. No.: 16/580,273

(22) Filed: Sep. 24, 2019

(65) Prior Publication Data

US 2021/0005516 A1 Jan. 7, 2021

(30) Foreign Application Priority Data

Jul. 1, 2019 (CN) .......................... 201910586768.4

(51) Int. Cl.
| | |
|---|---|
| *H01L 21/762* | (2006.01) |
| *H01L 21/78* | (2006.01) |
| *H01L 23/31* | (2006.01) |
| *H01L 23/495* | (2006.01) |
| *H01L 23/00* | (2006.01) |
| *H01L 29/40* | (2006.01) |

(52) U.S. Cl.
CPC ........ *H01L 21/78* (2013.01); *H01L 21/76224* (2013.01); *H01L 23/3185* (2013.01); *H01L 23/49575* (2013.01); *H01L 24/27* (2013.01); *H01L 24/32* (2013.01); *H01L 24/96* (2013.01); *H01L 29/401* (2013.01); *H01L 2224/32245* (2013.01)

(58) Field of Classification Search
CPC ......... H01L 21/76224; H01L 21/76267; H01L 21/78; H01L 21/782; H01L 21/823885
See application file for complete search history.

(56) References Cited

U.S. PATENT DOCUMENTS

2004/0113283 A1* 6/2004 Farnworth .......... H01L 21/6835
257/782

* cited by examiner

*Primary Examiner* — Hoai V Pham
(74) *Attorney, Agent, or Firm* — Alan D. Kamrath; Karin L. Williams; Mayer & Williams PC

(57) ABSTRACT

The present invention relates to a method of manufacturing a power device and a structure of the power device, which is used to solve the problem that conventional power device needs to be independently packaged and requires a welding process. The method includes: forming a plurality of semiconductor device layers spaced in intervals on a front of a silicon wafer; excavating a plurality of grooves on the front of the silicon wafer to separate the plurality of semiconductor device layers; filling each of the plurality of grooves with each of a plurality of first spacer materials; grinding a back of the silicon wafer until the first spacer materials being exposed; attaching a plurality of metal layers to a region of the back of the silicon wafer opposite to the plurality of semiconductor device layers; and electrically connecting each of independent plurality of lead frames to the plurality of metal layers respectively. The present invention further includes the structure of the power device.

10 Claims, 5 Drawing Sheets

METHOD OF MANUFACTURING POWER DEVICE WITH IMPROVED THE UTILIZATION RATE OF WAFER AREA

CROSS REFERENCE TO RELATED APPLICATION

The application claims the benefit of China application serial No. 201910586768.4, filed on Jul. 1, 2019, and the entire contents of which are incorporated herein by reference.

BACKGROUND OF THE INVENTION

1. Field of the Invention

The present invention relates to a manufacturing process of semiconductor, in particular to a structure of power device and a method of manufacturing thereof with simplified manufacturing process and fast installation.

2. Description of the Related Art

Power devices are electronic components used for switching control and power transmission conversion, such as metal oxide semiconductor field effect transistor (MOSFET), diodes, insulated gate bipolar transistor (IGBT), etc. Before using a plurality of independent power devices, each power device must be connected to its own independent lead frame, then connected to lead pins and packaged for protection, so as to avoid the plurality of independent power devices to form a structure of a common drain (e.g. MOSFET) or a common collector (e.g. IGBT).

Referring to FIG. 1, a conventional power device 9 is manufactured by stacking the materials of oxide, semiconductor on the upper surface of a substrate 91 to form semiconductor devices 92 separated each other, then the plurality of semiconductor devices 92 and the substrate 91 are separated into several independent grains 93 by back grinding and dicing processes. Each grain 93 may be packaged by packaging processes of bonding and molding to produce the plurality of independent power devices 9 that is able be respectively mounted on board and acted in the circuit.

In the process of the conventional power element 9 mentioned above, the dicing loss space must be reserved between the plurality of semiconductor devices 92 because the plurality of grains 93 must be separated by dicing, and different size of the plurality of semiconductor devices 92 must be properly allocated to the substrate 91, leading hardly to utilize the area of the substrate 91 effectively. In addition, in the case of the plurality of independent power devices 9 being used at the same time, the bonding circuit must be welded one by one, resulting in prolonged processing time and low utilization rate of installation space of components.

In view of this, it is necessary to improve the conventional methods of manufacturing of power devices and the conventional structures of power devices.

SUMMARY OF THE INVENTION

In order to solve the above problems, the object of the present invention is to provide a method of manufacturing power devices, which can simplify the steps of grain dicing and subsequent packaging.

The object of the present invention is to provide a method of manufacturing power devices, which can improve the utilization rate of wafer area.

The object of the present invention is to provide a structure of power devices, which can save installation time and space of a circuit.

The object of the present invention is to provide a power device, which can integrate a plurality of power chips into a single device, and the plurality of power chips do not interfere with each other.

The directionality or the approximate terms thereof, such as "upper", "top", "below", "bottom", "front", "back" and "surface" mentioned in the full text of the present invention refer mainly to the direction of the drawings. The directionality or the approximate terms thereof are used only to assist in explaining and understanding various embodiments of the present invention, rather than to limit the invention.

A method of manufacturing power device of the present invention comprises: forming a plurality of semiconductor device layers spaced in intervals on a front of a silicon wafer; excavating a plurality of grooves on the front of the silicon wafer to separate the plurality of semiconductor device layers; filling each of the plurality of grooves with each of a plurality of first spacer materials; grinding a back of the silicon wafer until the first spacer materials being exposed; attaching a plurality of metal layers to a region on the back of the silicon wafer opposite to the plurality of semiconductor device layers; and electrically connecting each of independent plurality of lead frames to the plurality of metal layers respectively.

Another method of manufacturing power device of the present invention comprises: forming a plurality of semiconductor device layers spaced in intervals on a front of a silicon wafer; excavating a plurality of grooves on the front of the silicon wafer to separate the plurality of semiconductor device layers; filling each of the plurality of grooves with each of a plurality of first spacer materials; grinding a back of the silicon wafer until the first spacer materials being exposed; attaching a plurality of second spacer materials to a region on the back of the silicon wafer respectively corresponding to the plurality of first spacer materials respectively; attaching a metal layer on the back of the silicon wafer; second grinding the back of the silicon wafer until the second spacer materials being exposed, and forming the plurality of metal layers to cover a region opposite to the plurality of semiconductor device layers; and electrically connecting each of independent plurality of lead frames to the plurality of metal layers respectively.

A power device of the present invention comprises: a plurality of semiconductor device layers; a plurality of silicon layers, wherein the plurality of semiconductor device layers is respectively formed on an upper surface of the plurality of silicon layers; a plurality of first spacer materials, respectively disposed between the plurality of silicon layers, and wherein the plurality of semiconductor device layers is respectively separated by the plurality of first spacer materials; a plurality of metal layers, respectively formed on a lower surface of the plurality of silicon layers; and a plurality of lead frames, respectively electrically connected to the plurality of metal layers. The power device of the present invention further comprises a plurality of second spacer materials, respectively disposed on the other side of the plurality of first spacer materials opposite to the plurality of semiconductor device layers, and the plurality of metal layers is respectively separated by the plurality of second spacer materials.

Accordingly, the method of manufacturing power device and structure of the power device of the present invention can simplify the steps of grain dicing and subsequent packaging by integrating a plurality of power semiconductor devices into a single device in the front-end manufacturing processing of the wafer, and save the area of the silicon wafer with dicing loss, thus providing the effects of increasing the utilization rate of the wafer and simplifying the manufacturing process. In addition, when the plurality of power devices are used at the same time, a single device may be installed to save time of welding one by one, providing the effects of increasing installation efficiency and utilization rate of installation space.

Wherein excavating the plurality of grooves allows the silicon wafer to form a structure from which the plurality of silicon layers staggers and protrude outs of the front of the silicon wafer, and the plurality of semiconductor device layers is respectively formed at the top of the plurality of silicon layers. In this way, the plurality of semiconductor device layers may be diced, and thus providing the effects of avoiding the interference between the electrical functions of the plurality of semiconductor device layers.

Wherein the plurality of metal layers is respectively attached to one end of the plurality of silicon layers opposite to the plurality of semiconductor device layers. In this way, each metal layer may be used as an electrode corresponding to the semiconductor device layer, providing the effects of conduction, heat dissipation and thinning.

Wherein the plurality of first spacer materials is respectively filled into the plurality of grooves until the plurality of first spacer materials is aligned and flattened with the plurality of semiconductor device layers. In this way, the plurality of semiconductor device layers may be efficiently isolated, providing the effects of avoiding affecting the subsequent wiring process and electrical interference.

Wherein the plurality of metal layers respectively covered a region of each of the plurality of silicon layers is formed after second grinding and is separated by the plurality of second spacer materials. In this way, the short circuit between the plurality of metal layers may be avoided, providing the effect of ensuring the independent operation of the power device.

Wherein a distribution pattern of the plurality of second spacer materials on the back of the silicon wafer is the same as that of the plurality of first spacer materials on the front of the silicon wafer. In this way, the isolation effect may be maintained while avoiding affecting the electrical areas of the plurality of semiconductor device layers and the plurality of metal layers, providing the effect of increasing the space utilization rate of the silicon wafer.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE INVENTION

In order to make the above and other purposes, features and advantages of the present invention more obvious and understandable, the preferred embodiments of the present invention are hereinafter highlighted and illustrated in detail with the accompanying drawings as follows:

Referring to FIGS. 2-7, the process steps of the first embodiment of the method of manufacturing the power device of the present invention comprises forming a plurality of semiconductor device layers 1 spaced in intervals on a front of a silicon wafer W; excavating a plurality of grooves T on the front of the silicon wafer W to separate the plurality of semiconductor device layers 1 and a plurality of silicon layers; filling each of the plurality of grooves T with each of a plurality of first spacer materials 3; grinding a back of the silicon wafer W until the first spacer materials 3 being exposed; attaching a plurality of metal layers 4 to a region on the back of the silicon wafer W opposite to the plurality of semiconductor device layers 1; and electrically connecting each of independent plurality of lead frames 5 to the plurality of metal layers 4 respectively.

Figure 1:
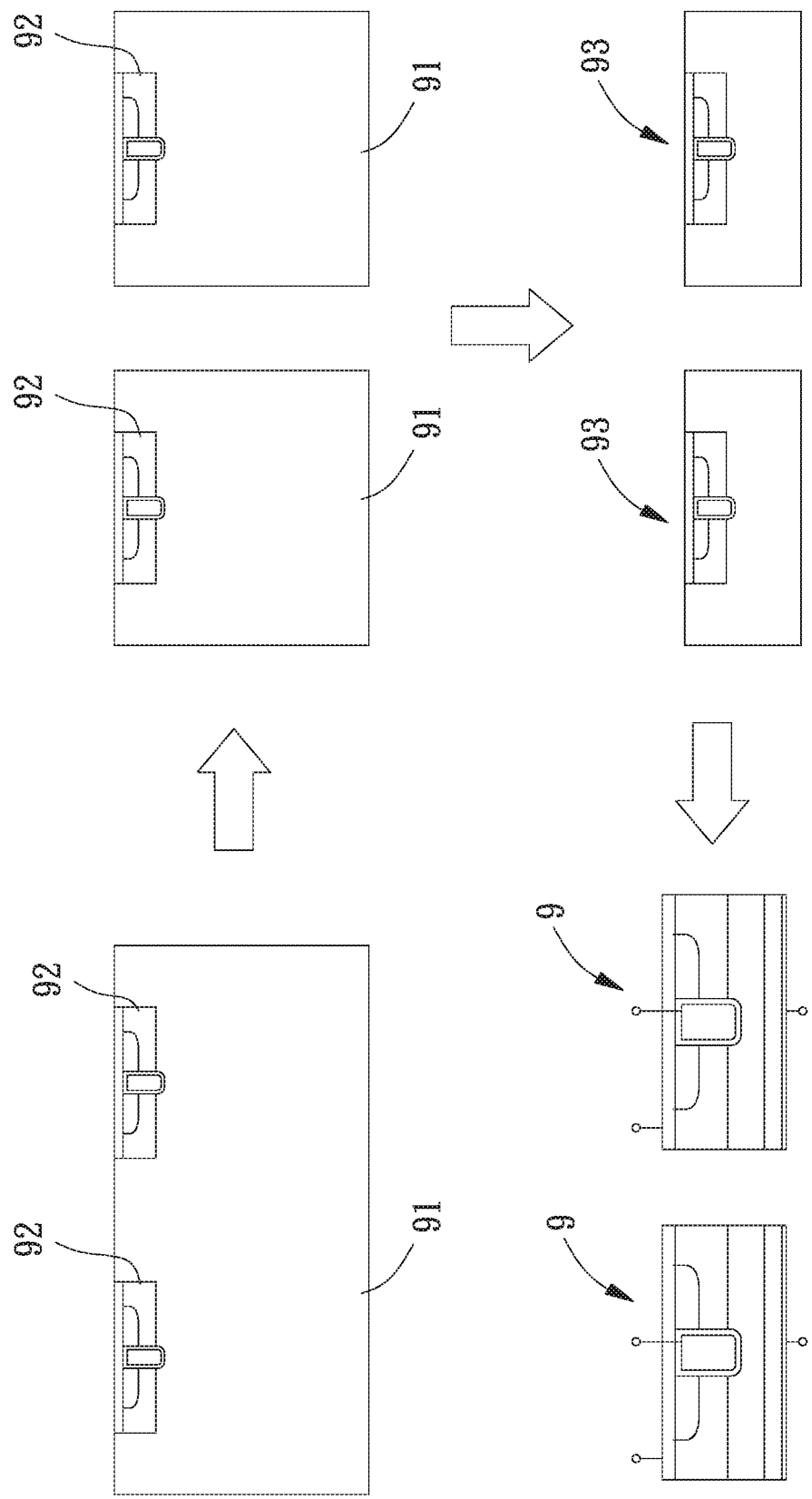
FIG. 1 is a manufacturing process of a conventional power device.
Figure 2:
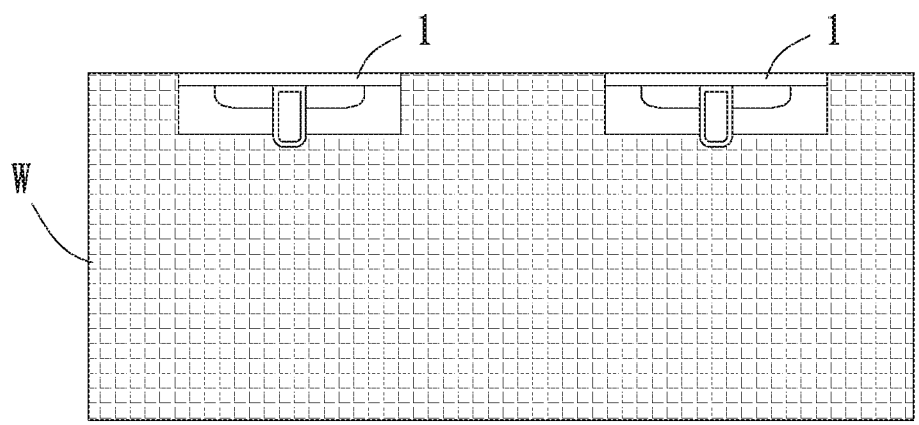
FIG. 2 is a case diagram of a front-end process of a first embodiment of the present invention.

Referring to FIG. 2, different functional combinations of each of the plurality of semiconductor device layers 1 was integrated on the front of the silicon wafer W through the semiconductor front-end process, and the plurality of semiconductor device layers 1 had appropriate distances from each other, avoiding the interference between the electrical functions of the plurality of semiconductor device layers 1.

Figure 3:
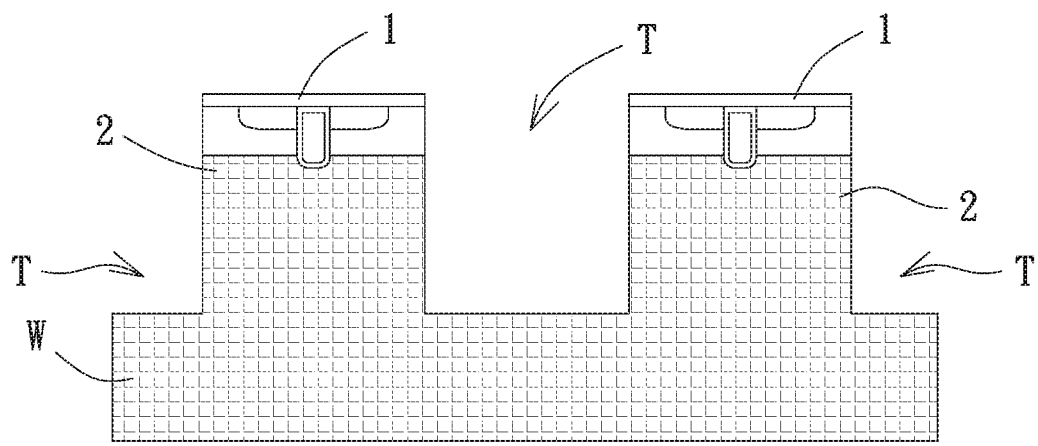
FIG. 3 is a case diagram of an excavating step according to the first embodiment of the present invention.

Referring to FIG. 3, the plurality of grooves T were excavated outside the region of the plurality of semiconductor device layers 1 on the front of the silicon wafer W, allowing the silicon wafer W to form a structure from which the plurality of silicon layers 2 staggers and protrudes out of the front of the silicon wafer W, and the plurality of semiconductor device layers 1 was respectively formed at the top of the plurality of silicon layer 2.

Figure 4:
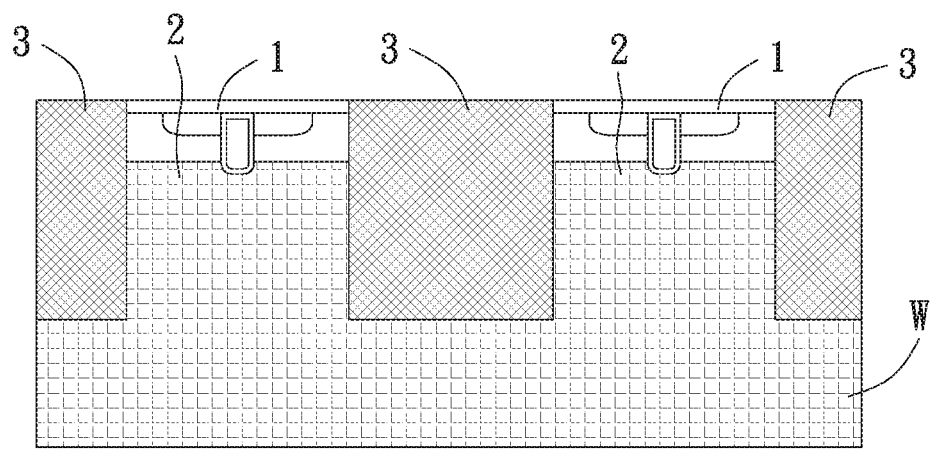
FIG. 4 is a case diagram of a filling step according to the first embodiment of the present invention.

Referring to FIG. 4, the plurality of first spacer materials 3 was respectively filled into the plurality of grooves T, preferably allowing the plurality of first spacer materials 3 to be aligned and flattened with the plurality of semiconductor device layers 1. Thus, it may indeed isolate the plurality of semiconductor device layers 1, and may also avoid affecting the subsequent wiring packaging process.

Figure 5:
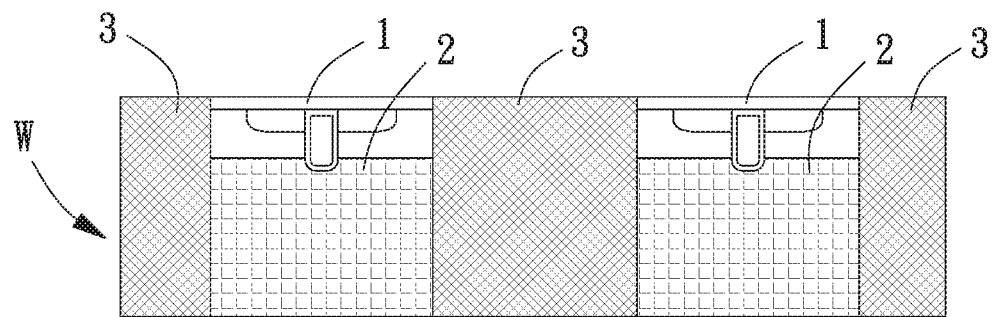
FIG. 5 is a case diagram of a grinding step according to the first embodiment of the present invention.

Referring to FIG. 5, in the semiconductor back-end process, the back of the silicon wafer W was ground to allow the thickness of the silicon wafer W to be fit to the desired size for subsequent packaging. The plurality of first spacer materials 3 was exposed on the back of the silicon wafer W through grinding, and each of the plurality of silicon layers 2 was separated from the silicon wafer W.

Figure 6:
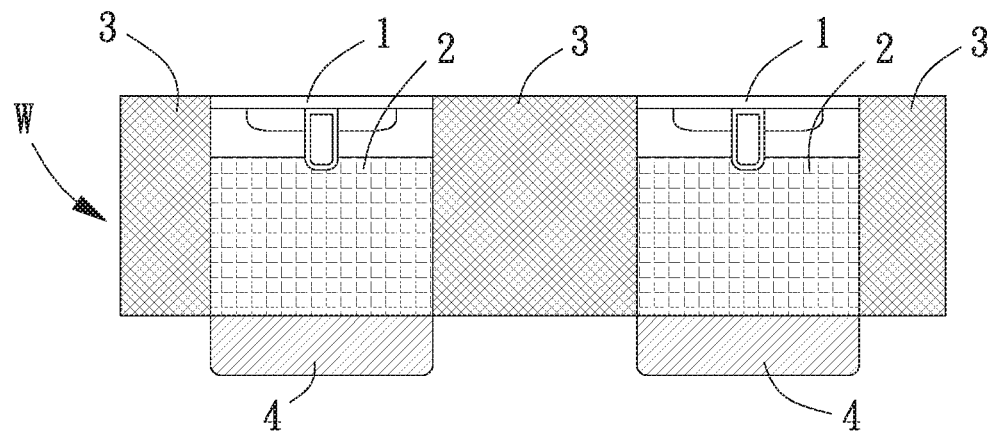
FIG. 6 is a case diagram of attaching metal layers according to the first embodiment of the present invention.

Referring to FIG. 6, the plurality of metal layers 4 was respectively attached to one end of the plurality of silicon layers 2 opposite to the plurality of semiconductor device layers 1. Each of the plurality of metal layers 4 may be used as an electrode of the corresponding semiconductor element layer 1, such as the collector of IGBT or the junction of the diode.

Figure 7:
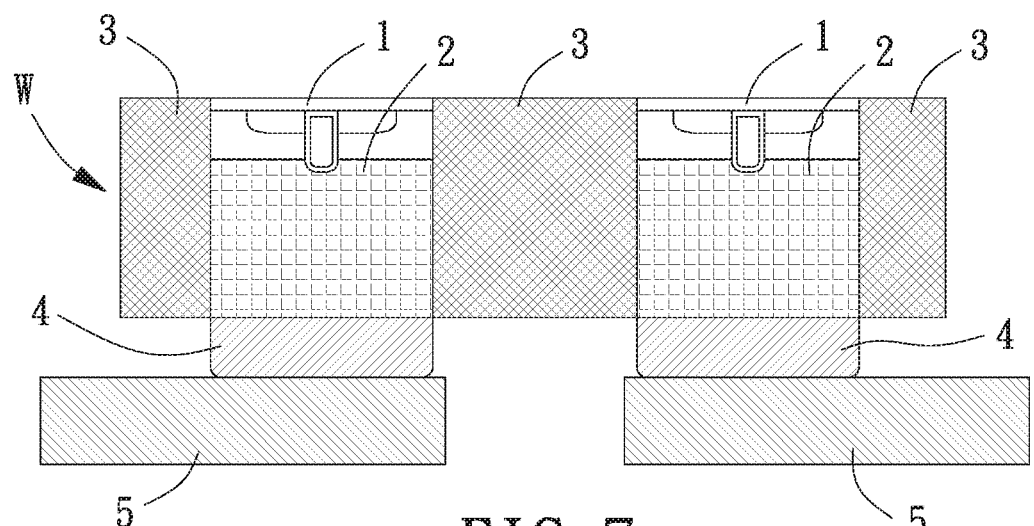
FIG. 7 is a structural diagram of package completed power device according to the first embodiment of the present invention.

Referring to FIG. 7, the plurality of lead frames 5 was electrically independent and electrically connected to the plurality of metal layers 4 respectively.

Referring to FIGS. 2-5 and FIGS. 8-11, which are the process steps of the second embodiment of the method of manufacturing the power device of the present invention, comprising: forming a plurality of semiconductor device layers 1 spaced in intervals on a front of a silicon wafer W; excavating a plurality of grooves T on the front of the silicon wafer W to separate the plurality of semiconductor device layers 1; filling each of the plurality of grooves T with each of a plurality of first spacer materials 3; grinding a back of the silicon wafer W until the first spacer materials 3 being exposed; attaching a plurality of second spacer materials 6 to a region on the back of the silicon wafer W respectively corresponding to the plurality of first spacer materials 3; attaching a metal layer 4 on the back of the silicon wafer W; grinding the back of the silicon wafer W until the second spacer materials 6 being exposed, and retaining the metal layer 4 in a region opposite to the plurality of semiconductor device layers 1; and electrically connecting each of independent plurality of lead frames 5 to the plurality of metal layers 4 respectively.

Referring to FIGS. 2-5, the first four process steps of the second embodiment of the present invention are the same as those of the first embodiment. As shown in FIG. 5, the plurality of semiconductor device layers 1 was formed and attached to the plurality of silicon layers 2. The plurality of first spacer materials 3 was separated from the plurality of semiconductor device layers 1 and the plural silicon layers 2 respectively.

Figure 8:
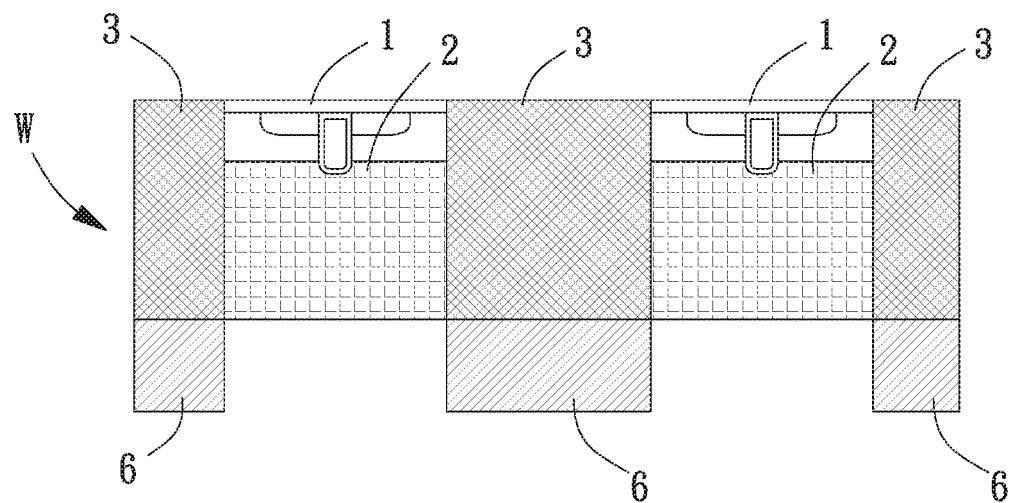
FIG. 8 is a case diagram of attaching spacer layers of a second embodiment of the present invention.

Referring to FIG. 8, the plurality of second spacer materials 6 was respectively attached to one side of the plurality of first spacer materials 3 on the back of the silicon wafer W, allowing a distribution pattern of the plurality of second spacer materials 6 on the back of the silicon wafer W was the same as that of the plurality of first spacer materials 3 on the front of the silicon wafer W.

Figure 9:
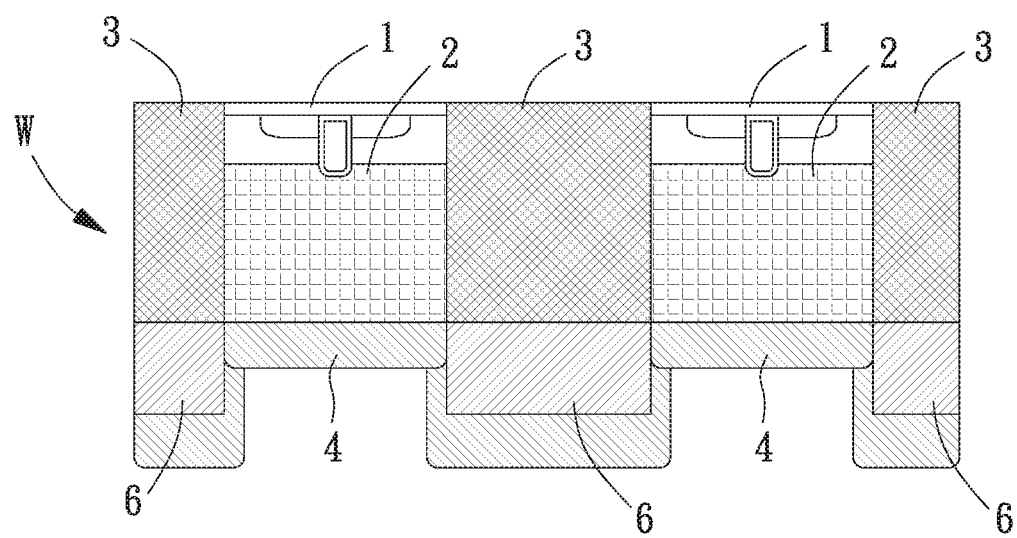
FIG. 9 is a case diagram of attaching metal layers according to the second embodiment of the present invention.

Referring to FIG. 9, the plurality of metal layers 4 was formed on the back of the silicon wafer W and respectively attached to the plurality of silicon layers 2 and the plurality of second spacer materials 6, allowing the plurality of metal layers 4 to be intercommunicated and completely covered the back of the silicon wafer W.

Figure 10:
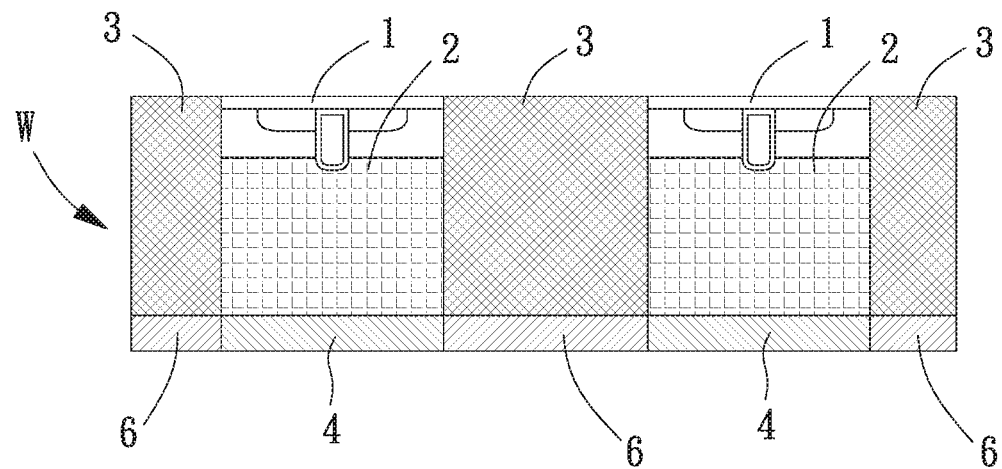
FIG. 10 is a case diagram of a grinding step according to the second embodiment of the present invention.

Referring to FIG. 10, the plurality of second spacer materials 6 was exposed through second grinding the back of the silicon wafer W, and the plurality of metal layers 4 respectively only covered the regions of the plurality of silicon layers 2. The plurality of metal layers 4 was separated by the plurality of second spacer materials 6, and it may avoid the short circuit to be happened between the plurality of metal layers 4, which may affect the electrical functions of the corresponding semiconductor element layer 1 and silicon layer 2. In addition, preferably, aligning and flattening the plurality of metal layers 4 with the plurality of second spacer materials 6 may avoid affecting the subsequent wiring packaging process.

Figure 11:
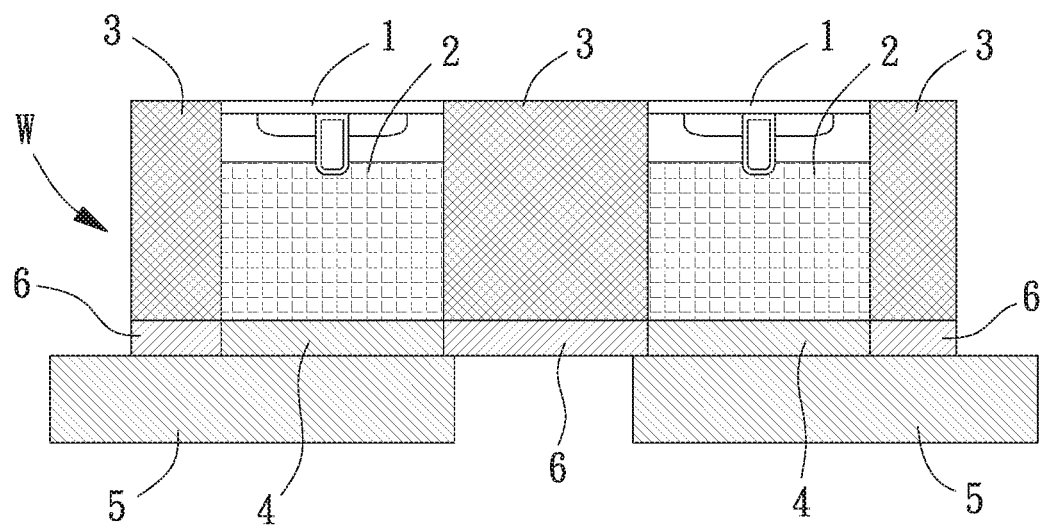
FIG. 11 is a structural diagram of package completed power device according to the second embodiment of the present invention.

Referring to FIG. 11, the plurality of lead frames 5 was electrically independent and electrically connected to the plurality of metal layers 4, respectively.

Referring to FIG. 7, the power device is manufactured according to the first embodiment of the method of manufacturing the power device described above, comprising the plurality of semiconductor device layers 1, the plurality of silicon layers 2, the plurality of first spacer materials 3, the plurality of metal layers 4 and the plurality of lead frames 5. The plurality of semiconductor device layers 1 was respectively formed on the upper surfaces of the plurality of silicon layers 2. The plurality of semiconductor device layers 1 was separated by the plurality of first spacer materials 3 respectively. Each of the plurality of metal layers 4 was located on the lower surface of each of the plurality of silicon layers 2. The plurality of lead frames 5 was connected to the plurality of silicon layers 2 one by one through each of the plurality of metal layers 4.

Each of semiconductor device layers 1 may be constructed by stacking according to the front-end processes such as deposition, etching and wiring with different doping content of semiconductors (e.g. P-type semiconductors, N-type semiconductors), insulating materials (e.g. silicon dioxide) and conducting materials (e.g. metals, polycrystalline silicon, etc.). Each of semiconductor device layers 1 may be an electronic device such as a transistor, a diode or a capacitor. The plurality of semiconductor device layers 1 was spaced in intervals from each other and arranged on the same surface of the power device of the present invention.

The plurality of silicon layers 2 may be formed in an individual separated state by the process of ditching and filling of the silicon wafer W. The plurality of silicon layers 2 bears the plurality of semiconductor device layers 1 on by on.

The plurality of first spacer materials 3 was electrical insulating materials (e.g. silicon dioxides, ceramics, resins or composites thereof), and the plurality of first spacer materials 3 was respectively disposed between the plurality of semiconductor device layers 1 to prevent the plurality of semiconductor device layers 1 from conducting to each other. The plurality of first spacer materials 3 may also separate the plurality of silicon layers 2.

Each of the plurality of metal layers 4 and each of the plurality of lead frames 5 were disposed on one side of the plurality of the silicon layers 2 opposite to the plurality of semiconductor device layers 1. Each of the plurality of silicon layers 2 was respectively connected to each of the independent plurality of lead frames 5 through the plurality of metal layers 4. The plurality of metal layers 4 has the functions of conduction, heat dissipation and thinning Each of the plurality of lead frames 5 provides a conduction path to connect the functions of the power device to the external system.

Referring to FIG. 11, the power device manufactured according to the second embodiment of the method manufacturing the power device described above. In this embodiment, the power device further comprises the plurality of second spacer materials 6, and each of the plurality of second spacer materials 6 respectively located on one side of the plurality of first spacer materials 3 opposite to the semiconductor device layer 1. Preferably, each of the plurality of second spacer materials 6 has the same distribution pattern the same as each of the plurality of first spacer materials 3, and the plurality of second spacer materials 6 may be used to separate the plurality of metal layers 4, providing the effect of avoiding short circuit between the plurality of metal layers 4.

In summary, the method of manufacturing the power device and structure of the power device of the present invention may simplify the steps of grain dicing and subsequent packaging by integrating a plurality of power devices into a single device in the front-end manufacturing process of the wafer, and save the area of the silicon wafer with dicing loss, thus providing the effects of increasing the utilization rate of the wafer and simplifying the manufacturing process. In addition, when the plurality of power devices are used at the same time, a single component may be installed to save time of welding one by one, providing the effects of increasing installation efficiency and utilization rate of installation space.

While the preferred embodiments of the invention have been set forth for the purpose of disclosure, they are not the limitations of the invention, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method of manufacturing a power device, comprising:
    forming a plurality of semiconductor device layers spaced in intervals on a front of a silicon wafer;
    excavating a plurality of grooves on the front of the silicon wafer to separate the plurality of semiconductor device layers;
    filling each of the plurality of grooves with each of a plurality of first spacer materials;
    grinding a back of the silicon wafer until the first spacer materials being exposed;
    attaching a plurality of metal layers to a region on the back of the silicon wafer opposite to the plurality of semiconductor device layers; and
    electrically connecting each of independent plurality of lead frames to the plurality of metal layers respectively.

2. The method according to claim 1, wherein the plurality of grooves are excavated on the front of the silicon wafer, allowing the silicon wafer to form a structure from which a plurality of silicon layers staggers and protrudes out of the front of the silicon wafer, and the plurality of semiconductor device layers is respectively formed at the top of the plurality of silicon layers.

3. The method according to claim 2, wherein the plurality of metal layers is respectively attached to one end of the plurality of silicon layers opposite to the plurality of semiconductor device layers.

4. The method according to claim 1, wherein the plurality of first spacer materials is respectively filled into the plurality of grooves until the plurality of first spacer materials is aligned and flattened with the plurality of semiconductor device layers.

5. A method of manufacturing a power device, comprising:
    forming a plurality of semiconductor device layers spaced in intervals on a front of a silicon wafer;
    excavating a plurality of grooves on the front of the silicon wafer to separate the plurality of semiconductor device layers;
    filling each of the plurality of grooves with each of a plurality of first spacer materials;
    grinding a back of the silicon wafer until the first spacer materials being exposed;
    attaching a plurality of second spacer materials to a region on the back of the silicon wafer respectively corresponding to the plurality of first spacer materials;
    attaching a metal layer on the back of the silicon wafer;
    second grinding the back of the silicon wafer until the second spacer materials being exposed, and forming the plurality of metal layers to cover a region opposite to the plurality of semiconductor device layers; and
    electrically connecting each of independent plurality of lead frames to the plurality of metal layers respectively.

6. The method according to claim 5, wherein the plurality of grooves are excavated on the front of the silicon wafer, allowing the silicon wafer to form a structure from which plurality of silicon layers staggers and protrudes out of the front of the silicon wafer, and the plurality of semiconductor device layers is respectively formed at the top of the plurality of silicon layers.

7. The method according to claim 6, wherein the metal layer is attached to the plurality of silicon layers and the plurality of second spacer materials on the back of the silicon wafer.

8. The method according to claim 7, wherein the plurality of metal layers formed by second grinding is respectively covered a region of the plurality of silicon layers and separated by the plurality of second spacer materials.

9. The method according to claim 5, wherein the plurality of first spacer materials is respectively filled into the plurality of grooves until the plurality of first spacer materials are aligned and flattened with the plurality of semiconductor device layers.

10. The method according to claim 5, wherein a distribution pattern of the plurality of second spacer materials on the back of the silicon wafer is the same as that of the plurality of first spacer materials on the front of the silicon wafer.

* * * * *